(12) United States Patent
Habuka et al.

(10) Patent No.: US 11,091,367 B2
(45) Date of Patent: Aug. 17, 2021

(54) VANADIUM SILICON CARBONITRIDE FILM, VANADIUM SILICON CARBONITRIDE FILM COATED MEMBER, AND METHOD FOR MANUFACTURING THE SAME

(71) Applicant: DOWA THERMOTECH CO., LTD., Tokyo (JP)

(72) Inventors: Satoru Habuka, Aichi (JP); Hiroyuki Matsuoka, Aichi (JP); Wataru Sakakibara, Aichi (JP)

(73) Assignee: DOWA THERMOTECH CO., LTD., Tokyo (JP)

( * ) Notice: Subject to any disclaimer, the term of this patent is extended or adjusted under 35 U.S.C. 154(b) by 175 days.

(21) Appl. No.: 16/606,467

(22) PCT Filed: Aug. 8, 2018

(86) PCT No.: PCT/JP2018/029716
§ 371 (c)(1),
(2) Date: Oct. 18, 2019

(87) PCT Pub. No.: WO2019/035397
PCT Pub. Date: Feb. 21, 2019

(65) Prior Publication Data
US 2020/0346928 A1    Nov. 5, 2020

(30) Foreign Application Priority Data

Aug. 14, 2017 (JP) .............................. JP2017-156684

(51) Int. Cl.
*C01B 21/082* (2006.01)
*B21D 37/01* (2006.01)
(Continued)

(52) U.S. Cl.
CPC .......... *C01B 21/0828* (2013.01); *B21D 37/01* (2013.01); *B21D 37/20* (2013.01);
(Continued)

(58) Field of Classification Search
CPC ...... C01B 21/0828; C23C 16/34; C23C 16/36
(Continued)

(56) References Cited

U.S. PATENT DOCUMENTS

| 8,309,235 | B2 * | 11/2012 | Vetter .................. | C23C 14/024 428/697 |
| 2006/0177698 | A1 * | 8/2006 | Yamamoto .......... | C23C 14/0664 428/698 |
| 2012/0115760 | A1 * | 5/2012 | Yamamoto .......... | C23C 14/0688 508/155 |

FOREIGN PATENT DOCUMENTS

| JP | 2002-371352 | 12/2002 |
| JP | 2005-46975 | 2/2005 |

(Continued)

OTHER PUBLICATIONS

International Search Report issued in International Patent Application No. PCT/JP2018/029716, dated Nov. 6, 2018.
(Continued)

*Primary Examiner* — Archene A Turner
(74) *Attorney, Agent, or Firm* — Greenblum & Bernstein, P.L.C.

(57) ABSTRACT

A vanadium silicon carbonitride film includes vanadium, silicon, carbon, and nitrogen, wherein when vanadium element concentration/(vanadium element concentration+silicon element concentration+carbon element concentration+nitrogen element concentration) in the film is defined as a, and silicon element concentration/(vanadium element concentration+silicon element concentration+carbon element concentration+nitrogen element concentration) in the film is defined as b, $0.30 \leq a/b \leq 1.3$ and $0.30 \leq a+b \leq 0.70$ are satisfied, (Continued)

and a total of the vanadium element concentration, the silicon element concentration, the carbon element concentration, and the nitrogen element concentration in the film is 90 [at %] or more.

9 Claims, 1 Drawing Sheet

(51) Int. Cl.
*B21D 37/20* (2006.01)
*B23B 27/14* (2006.01)
*C23C 16/36* (2006.01)
*C23C 16/50* (2006.01)

(52) U.S. Cl.
CPC ............. *B23B 27/14* (2013.01); *C23C 16/36* (2013.01); *C23C 16/50* (2013.01)

(58) Field of Classification Search
USPC .................................................. 428/697, 698
See application file for complete search history.

(56) References Cited

FOREIGN PATENT DOCUMENTS

| JP | 2006-93550 | 4/2006 |
| JP | 2016-204202 | 12/2016 |
| WO | 2010/150411 | 12/2010 |
| WO | 2018/124279 | 7/2018 |

OTHER PUBLICATIONS

Written Opinion of the International Searching Authority issued in International Application No. PCT/JP2018/029716, dated Nov. 6, 2018.

* cited by examiner

VANADIUM SILICON CARBONITRIDE FILM, VANADIUM SILICON CARBONITRIDE FILM COATED MEMBER, AND METHOD FOR MANUFACTURING THE SAME

TECHNICAL FIELD

The present invention relates to a vanadium silicon carbonitride film (VSiCN film) being a hard film formed on a surface of a base material, a coated member coated with the vanadium silicon carbonitride film, and a method for manufacturing the same.

BACKGROUND ART

Generally, a steel material is often used as a base material of a die of press forming, a cutting tool, a gear cutting tool, a forging tool, an automotive part and so on, and it has been conventionally performed to form a hard film higher in hardness than the steel material being the base material on the surface of the base material to coat the base material therewith in order to maintain the durability of those products. One kind of the hard film is vanadium-based coating high in film hardness and rich in lubricity. Patent Document 1 discloses a vanadium carbonitride film (VCN film) containing vanadium (V), carbon (C), and nitrogen (N) and having a Vickers hardness HV of 2400 using the ion plating method.

PRIOR ART DOCUMENT

Patent Document

Patent Document 1: Japanese Laid-open Patent Publication No. 2005-46975

SUMMARY OF THE INVENTION

Problems to be Solved by the Invention

Since a harder film is normally richer in abrasion resistance as it is higher in hardness, a film having a much higher hardness is required from the viewpoint of improving the abrasion resistance. However, there is a limit in improvement of the hardness as the hard film in the vanadium carbonitride film as in Patent Document 1.

A vanadium silicon carbonitride film and a coated member for the vanadium silicon carbonitride film according to the present invention have been made in consideration of the above circumstances, and an object thereof is to improve the hardness of the hard film containing vanadium, carbon, and nitrogen.

Besides, a physical vapor deposition method represented by the ion plating method as in Patent Document 1 is poor in deposition uniformity of evaporating particles, and therefore there is a need to take measures to the film formation apparatus such as provision of a rotation mechanism at a work table in forming the hard film on a complicated shape article such as the die, the cutting tool, the gear cutting tool, the forging tool, the automotive part and so on. Therefore, for the conventional film formation method, a film formation apparatus of special specifications for the film formation of the complicated shape article needs to be prepared, bringing about a problem of an increase in cost accompanying the introduction of the film formation apparatus. On the other hand, as the film formation method excellent in deposition uniformity, the plasma chemical vapor deposition method is known. However, it has been unclear whether the plasma chemical vapor deposition method can be used for the film formation processing of the vanadium-based coating as the hard film.

A method for manufacturing a vanadium silicon carbonitride film coated member according to the present invention has been made in consideration of the above circumstances, and an object thereof is to improve the hardness of a hard film containing vanadium, carbon, and nitrogen, and to suppress the cost accompanying the introduction of a film formation apparatus.

Means for Solving the Problems

An aspect of the present invention to solve the above problem is a vanadium silicon carbonitride film including vanadium, silicon, carbon, and nitrogen, wherein when vanadium element concentration [at %]/(vanadium element concentration [at %]+silicon element concentration [at %]+carbon element concentration [at %]+nitrogen element concentration [at %]) in a film is defined as a, and silicon element concentration [at %]/(vanadium element concentration [at %]+silicon element concentration [at %]+carbon element concentration [at %]+nitrogen element concentration [at %]) in the film is defined as b, $0.30 \leq a/b \leq 1.3$ and $0.30 \leq a+b \leq 0.70$ are satisfied, and a total of the vanadium element concentration [at %], the silicon element concentration [at %], the carbon element concentration [at %], and the nitrogen element concentration [at %] in the film is 90 [at %] or more.

An aspect of the present invention according to another viewpoint is a vanadium silicon carbonitride film coated member, wherein the above-described vanadium silicon carbonitride film is formed on a base material.

An aspect of the present invention according to still another viewpoint is a method for manufacturing a vanadium silicon carbonitride film coated member, wherein the vanadium silicon carbonitride film coated member is manufactured by forming a vanadium silicon carbonitride film on a base material by a plasma chemical vapor deposition method using a raw material gas, the raw material gas including: a nitrogen source gas composed of one or more of gasses selected from the group consisting of a nitrogen gas and an ammonia gas; a hydrogen gas; a vanadium chloride gas; a silicon source gas; a carbon source gas, and wherein when vanadium element concentration [at %]/(vanadium element concentration [at %]+silicon element concentration [at %]+carbon element concentration [at %]+nitrogen element concentration [at %]) in the vanadium silicon carbonitride film is defined as a, and silicon element concentration [at %]/(vanadium element concentration [at %]+silicon element concentration [at %]+carbon element concentration [at %]+nitrogen element concentration [at %]) in the vanadium silicon carbonitride film is defined as b, $0.30 \leq a/b \leq 1.3$ and $0.30 \leq a+b \leq 0.70$ are satisfied, and a total of the vanadium element concentration [at %], the silicon element concentration [at %], the carbon element concentration [at %], and the nitrogen element concentration [at %] in the vanadium silicon carbonitride film is 90 [at %] or more.

Effect of the Invention

According to the present invention, it is possible to improve the hardness of a hard film containing vanadium, carbon, and nitrogen.

MODES FOR CARRYING OUT INVENTION

Figure 1:
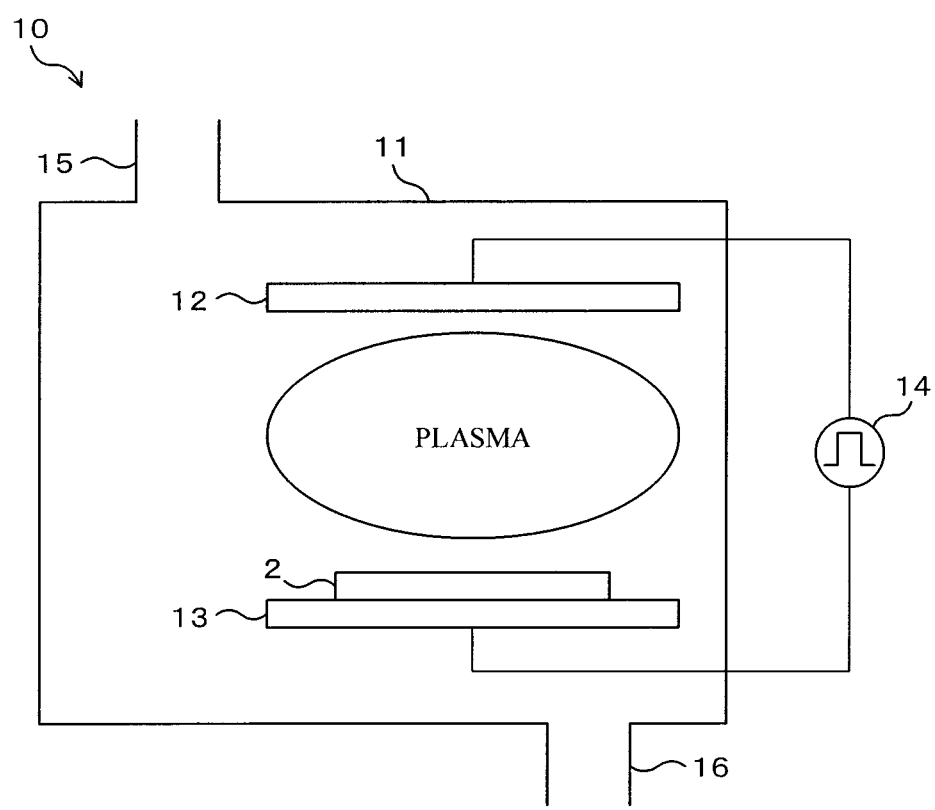
FIG. 1 A diagram illustrating a schematic configuration of a film formation apparatus for a vanadium silicon carbonitride film according to an embodiment of the present invention.

Hereinafter, an embodiment of the present invention will be explained referring to the drawings. Note that in this description and the drawings, the same codes are given to components having substantially the same functional configurations to omit duplicated explanation.

In this embodiment, a plasma chemical vapor deposition method (a so-called plasma CVD method) is used to form a vanadium silicon carbonitride film composed of vanadium, silicon, carbon, and nitrogen on a base material. Though steel materials such as die steel like SKD11, other tool steel and the like are used as the base material, the base material is not limited to these materials. Any material may be adopted as the base material as long as it requires a hard film treatment according to the strength inherent to the material and usage and so on.

As a film formation apparatus for forming a vanadium silicon carbonitride film, a plasma processing apparatus 10 as illustrated in FIG. 1 is used. The plasma processing apparatus 10 includes a chamber 11 into which a base material 2 is carried in, an anode 12 and a cathode 13, and a pulse power supply 14. A gas supply pipe 15 through which a raw material gas is supplied is connected to an upper part of the chamber 11, and a gas exhaust pipe 16 which exhausts gas in the chamber is connected to a lower part of the chamber 11. On the downstream side of the gas exhaust pipe 16, a vacuum pump (not illustrated) is provided. The cathode 13 also has a role as a support table which supports the base material 2, and the base material 2 carried in the chamber 11 is mounted on the cathode. Further, inside the chamber 11, a heater (not illustrated) is provided, so that the heater may adjust an atmospheric temperature in the chamber 11.

The plasma processing apparatus 10 in this embodiment is configured as described above, but the configuration of the plasma processing apparatus 10 is not limited to the one explained in this embodiment. For example, a high-frequency power supply may be used in place of the pulse power supply 14, or a shower head which supplies the raw material gas may be provided and used as the anode 12. Besides, the base material 2 may be heated only with glow current without providing the heater. In short, the plasma processing apparatus 10 only needs to have a structure capable of converting the raw material gas for the vanadium silicon carbonitride film supplied in the chamber 11 into plasma and form the vanadium silicon carbonitride film on the base material 2 so as to manufacture a vanadium silicon carbonitride film coated member. Note that as the plasma CVD method, the discharge method is not particularly limited as long as it is a method capable of forming the vanadium silicon carbonitride film by plasma discharge decomposition of the raw material gas under reduced pressure (or under atmospheric pressure), but it is preferable to form the vanadium silicon carbonitride film by a pulse discharge plasma CVD method.

Figure 2:
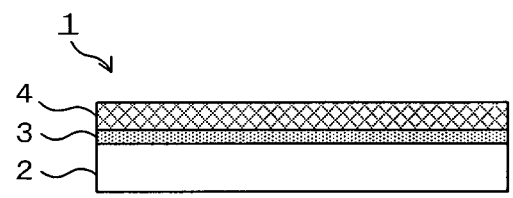
FIG. 2 A view illustrating a schematic configuration of a vanadium silicon carbonitride film coated member according to an embodiment of the present invention.

Next, a method for manufacturing the vanadium silicon carbonitride film coated member will be explained. In this embodiment, a vanadium silicon carbonitride film coated member 1 is manufactured by forming a vanadium nitride film 3 on the surface of the base material 2 and then forming a vanadium silicon carbonitride film 4 on the surface of the vanadium nitride film 3 as illustrated in FIG. 2.

<Film Formation Processing Preparation Step>

First of all, the base material 2 is carried into the chamber 11 and the base material 2 is set at a predetermined position. Thereafter, evacuation is performed so that the pressure in the chamber 11 becomes, for example, 10 Pa or less. In this event, the temperature in the chamber 11 is about room temperature. Subsequently, the heater (not illustrated) is operated to perform a baking treatment on the base material 2. Thereafter, the heater is once turned off, and the plasma processing apparatus 10 is let stand for a predetermined time to cool the base material 2. Next, a small amount of hydrogen gas is supplied into the chamber 11, and the heater is operated again to heat the atmosphere in the chamber 11. In this event, the atmospheric temperature in the chamber 11 is raised up to near a processing temperature suitable for film formation processing by the plasma CVD method. The pressure in the chamber 11 in this event only needs to be appropriately set and is maintained, for example, at about 100 Pa.

Subsequently, the hydrogen gas is converted into plasma prior to the later-described film formation processing using the plasma CVD method. More specifically, the pulse power supply 14 is operated in a state where the hydrogen gas supplied in heating the atmosphere in the chamber 11 is continuously supplied. This converts the hydrogen gas into plasma between the electrodes 12 and 13. Hydrogen radicals generated in this manner reduce an oxide film on the surface of the base material 2 and thereby clean the surface of the base material 2 before the film formation processing. Note that the voltage, frequency, Duty ratio and so on of the pulse power supply 14 are appropriately set so as to convert the gas supplied in the chamber 11 into plasma. Note that the Duty ratio is defined by voltage application time per cycle of a pulse, and calculated by Duty ratio=100×voltage application time (ON time)/{voltage application time (ON time)+voltage application stop time (OFF time)}. After converting the hydrogen gas into plasma, a nitrogen gas and an argon gas are further supplied into the chamber 11 while the supply of the hydrogen gas is maintained, thereby converting the hydrogen gas, the nitrogen gas, and the argon gas into plasma. This enables stabilization of the glow discharge before the formation of the vanadium nitride film 3.

<Film Formation Processing of Vanadium Nitride Film 3>

Thereafter, a vanadium chloride gas is further supplied into the chamber 11 as a vanadium source gas. This makes a state where the nitrogen gas, the vanadium chloride gas, the hydrogen gas, and the argon gas are supplied into the chamber 11 as the raw material gas for forming the vanadium nitride film 3. When assuming that the partial pressure of the vanadium chloride gas is 1, the ratio of partial pressures of the vanadium chloride gas, the nitrogen gas, the hydrogen gas, and the argon gas is set, for example, to 1:7-11:35-45:0.7-1.1. The pressure in the chamber 11 is set, for example, to 50 to 200 Pa.

Note that as the vanadium chloride gas, for example, a vanadium tetrachloride ($VCl_4$) gas or a vanadium trichloride oxide ($VOCl_3$) gas is used. It is preferable to use the vanadium tetrachloride gas in a viewpoint that the number of elements constituting the gas is smaller and removal of impurities in the vanadium nitride film 3 becomes easier. Further, the vanadium tetrachloride gas is preferable also in terms of being easily available, being liquid at room temperature, and being easy to supply as gas. Besides, the nitrogen source gas is not limited to the nitrogen gas but may be, for example, an ammonia gas. The nitrogen source gas may be supplied while the nitrogen gas and the ammonia gas are mixed together.

When the vanadium chloride gas is supplied into the chamber 11, the vanadium chloride gas is converted into plasma between the electrodes 12 and 13. Thus, vanadium and nitrogen converted into plasma between the electrodes 12 and 13 are adsorbed to the base material 2, whereby the vanadium nitride film 3 is formed on the surface of the base material 2. Note that the atmospheric temperature in the chamber 11 in the film formation processing of the vanadium nitride film 3 is preferably 450° C. to 550° C. Further, the voltage in the film formation processing is preferably 700 V to 1500 V.

<Film Formation Processing of Vanadium Silicon Carbonitride Film 4>

After the vanadium nitride film 3 is formed on the surface of the base material 2, an organic silane gas is further supplied into the chamber 11 as gases being a silicon source and a carbon source for forming the vanadium silicon carbonitride film 4. This makes a state where the vanadium chloride gas, the organic silane gas, the nitrogen gas, the hydrogen gas, and the argon gas are supplied into the chamber 11 as the raw material gas for forming the vanadium silicon carbonitride film 4. In this event, the flow rates of the gases are adjusted so that when the partial pressure of the vanadium chloride gas is 1, the ratio of partial pressures of the vanadium chloride gas, the organic silane gas, the nitrogen gas, the hydrogen gas, and the argon gas is set, for example, to 1:0.8-1.4:8-14:30-55:0.8-1.4. The pressure in the chamber 11 is set, for example, to 50 Pa to 200 Pa or less. Note that the voltage, frequency, Duty ratio and so on of the pulse power supply 14 are appropriately set so as to convert the gas supplied in the chamber 11 into plasma, and the voltage in the film formation processing of the vanadium silicon carbonitride film 4 is preferably 700 V to 1800 V. Further, the atmospheric temperature in the chamber 11 in the film formation processing of the vanadium silicon carbonitride film 4 is preferably 450° C. to 550° C.

The above-described "organic silane gas" is not particularly limited as long as it has a molecular structure in which a hydrocarbon functional group is bonded to silicon (Si) and, for example, a monomethylsilane gas, a dimethylsilane gas, a trimethylsilane gas, a tetramethylsilane gas or the like is used. The organic silane gas is a gas containing silicon and carbon, so that use of the organic silane gas in forming the vanadium silicon carbonitride film 4 eliminates the necessity of individually supplying two kinds of gases such as the silicon source gas and the carbon source gas. This enables decrease of the number of parts of a mechanism for supplying the raw material gas to the plasma processing apparatus 10. Note that in the case of separately supplying the silicon source gas and the carbon source gas into the chamber 11, for example, a silane-based gas such as a monosilane gas, a disilane gas, a dichlorosilane gas, a trichlorosilane gas, a silicon tetrafluoride gas, or a silicon tetrafluoride gas is used as the silicon source gas and, for example, a hydrocarbon gas such as methane, ethane, ethylene, or acetylene is used as the carbon source gas.

When the organic silane gas is supplied into the chamber 11, the organic silane gas is converted into plasma between the electrodes 12 and 13, and silicon and carbon are absorbed, together with vanadium and nitrogen which have been already brought into plasma, to the surface of the vanadium nitride film 3. As a result of this, the vanadium silicon carbonitride film 4 is formed on the surface of the vanadium nitride film 3. Thus, the vanadium silicon carbonitride film coated member 1 is manufactured.

The vanadium silicon carbonitride film 4 (VSiCN film) formed through the above steps is a hard film having a hardness of a Vickers hardness HV exceeding 2400 and a complex elastic modulus of 300 GPa or less. In other words, the vanadium silicon carbonitride film 4 in this embodiment is a hard film having a hardness higher than the hardness of the conventional vanadium carbonitride film (VCN film) containing vanadium, carbon, and nitride, a wider elastically deformed region because of a low complex elastic modulus, and a higher abrasion resistance as compared with a film having a nearly equal hardness.

In addition, the vanadium silicon carbonitride film 4 in this embodiment contains more silicon than before, and is therefore a hard film improved also in heat resistance. Accordingly, the vanadium silicon carbonitride film coated member 1 according to this embodiment is a member achieving both the hardness and the heat resistance at higher levels than before.

The vanadium silicon carbonitride film 4 is a film which satisfies 0.30≤a/b≤1.3 when defining, based on a vanadium element concentration [at %], a silicon element concentration [at %], a carbon element concentration [at %], and a nitrogen element concentration [at %] in the coating obtained from a composition analysis result of EPMA, a=vanadium element concentration [at %]/(vanadium element concentration [at %]+silicon element concentration [at %]+carbon element concentration [at %]+nitrogen element concentration [at %]) and b=silicon element concentration [at %]/(vanadium element concentration [at %]+silicon element concentration [at %]+carbon element concentration [at %]+nitrogen element concentration [at %]). When a/b is less than 0.30, the hardness of the vanadium silicon carbonitride film 4 cannot be sufficiently obtained. Similarly, also when a/b exceeds 1.3, the hardness of the vanadium silicon carbonitride film 4 cannot be sufficiently obtained. The preferable lower limit value of a/b is 0.50, and the more preferable lower limit is 0.6. On the other hand, the preferable upper limit value of a/b is 1.2, and the more preferable upper limit is 1.0. Further, the film thickness of the vanadium silicon carbonitride film 4 is preferably 0.5 to 4 μm.

Further, the vanadium silicon carbonitride film 4 is a film which also satisfies 0.30≤a+b≤0.70. When the contents of vanadium and silicon are too small with respect to the contents of carbon and nitrogen in the film, even the vanadium silicon carbonitride film 4 satisfying the above 0.30≤a/b≤1.3 may not sufficiently obtain the hardness as the hard film. Similarly, when the contents of vanadium and silicon are too large with respect to the contents of carbon and nitrogen in the film, even the vanadium silicon carbonitride film 4 satisfying the above 0.30≤a/b≤1.3 may not sufficiently obtain the hardness as the hard film. The preferable lower limit of a+b is 0.40, and the more preferable lower limit is 0.45. On the other hand, the preferable upper limit of a+b is 0.65, and the more preferable upper limit is 0.60.

Further, the vanadium silicon carbonitride film 4 is a film in which the total of the vanadium element concentration [at %], the silicon element concentration [at %], the carbon element concentration [at %], and the nitrogen element concentration [at %] is 90 [at %] or more. When the absolute amounts of vanadium, silicon, carbon, and nitrogen in the film are small, it is concerned that even the vanadium silicon carbonitride film 4 satisfying the above 0.30≤a/b≤1.3 may not sufficiently obtain the hardness as the hard film. Note that the carbon element concentration is preferably 10 [at %] or more. Further, the nitrogen element concentration is preferably 10 [at %] or more.

The plasma CVD method is used in forming the vanadium silicon carbonitride film 4 in this embodiment, and use of the plasma CVD method enables use of an apparatus equivalent to the film formation apparatus used in the film formation processing of other than a complicated shape article also in the film formation processing for the complicated shape article. In other words, formation of the vanadium silicon carbonitride film 4 by the plasma CVD method eliminates the need of a film formation apparatus of special specifications for the complicated shape article, thus enabling reduction of cost accompanying the introduction of the film formation apparatus. In addition, even in a situation where both of the film formation apparatus of special specifications for the complicated shape article and the film formation apparatus of ordinary specifications are necessary in the case of using the conventional film formation method, the film formation apparatus of special specifications becomes unnecessary according to the film formation method in this embodiment, thus enabling reduction in the number of film formation apparatuses to be installed in a factory. This can increase the degree of freedom of the facility layout in the factory.

Note that according to the film formation method in this embodiment, because the vanadium chloride gas is used as the vanadium source gas in forming the vanadium nitride film 3 and in forming the vanadium silicon carbonitride film 4, chlorine is necessarily contained, as an impurity as the balance excluding vanadium, silicon, and nitrogen, in the vanadium nitride film 3 and the vanadium silicon carbonitride film 4. The hydrogen gas contained in the raw material gas is likely to combine with chlorine, so that when the hydrogen gas is contained as the raw material gas as in this embodiment, chlorine generated from the vanadium chloride gas combines with hydrogen and becomes more likely to be discharged to the outside of the system. This can suppress mixture of chlorine into films such as the vanadium nitride film 3 and the vanadium silicon carbonitride film 4. Note that in the balance in the vanadium nitride film 3 and the vanadium silicon carbonitride film, inevitable impurities can be contained in addition to chlorine contained in the case of this embodiment.

The flow rate of the hydrogen gas during the plasma processing is preferably 25 times or more the flow rate of the vanadium chloride gas.

While the one embodiment of the present invention has been described, the present invention is not limited to the example. It should be understood that various change examples and modification examples are readily apparent to those skilled in the art within the technical spirit as set forth in claims, and those should also be covered by the technical scope of the present invention.

For example, the argon gas is contained in the raw material gas in the above embodiment, but supply of the argon gas is not essential. Argon ions of the argon gas ionize other molecules and thereby contribute to stabilization of plasma and improvement in ion density, and therefore the argon gas is preferably supplied as needed.

Further, though the vanadium nitride film 3 is formed on the surface of the base material 2 and then the vanadium silicon carbonitride film 4 is formed on the surface of the vanadium nitride film 3 in the above embodiment, the vanadium silicon carbonitride film 4 may be formed directly on the surface of the base material 2. However, to improve the adhesion between the base material 2 and the vanadium silicon carbonitride film 4, it is preferable to form the vanadium nitride film 3 between the base material 2 and the vanadium silicon carbonitride film 4.

EXAMPLES

A vanadium silicon carbonitride film was formed on the surface of the base material using the plasma CVD method, and the hardness and the heat resistance of the film were evaluated. Note that the flow rates of the hydrogen gas, the nitrogen gas, the argon gas, the vanadium tetrachloride gas, the silicon tetrachloride gas, and the monomethylsilane gas in the following explanation are volume flow rates at 0° C. and 1 atm.

As the base material on which the vanadium silicon carbonitride film was formed, a base material was used which was obtained by performing quenching and tempering treatments on a round bar of φ 22 composed of SKD11 being one kind of the die steel and then cutting the round bar at an interval of 6 to 7 mm, and performing mirror polishing on the surface of each cut member. Note that the vanadium silicon carbonitride film was formed on a surface on the side subjected to the mirror polishing of the base material. The film formation apparatus having the structure illustrated in FIG. 1 was used, and the pulse power supply was used as the power supply.

Here, the method for manufacturing a test piece in Example 1 will be described.

<Film Formation Processing Preparation Step>

First of all, the base material is set in the chamber of the film formation apparatus, evacuation of air in the chamber is performed for 30 minutes to reduce the pressure in the chamber down to 10 Pa or less. In this event, the heater is not operated. Note that the heater is provided inside the chamber, and the atmospheric temperature in the chamber is being measured by a sheathed thermocouple. Subsequently, the setting temperature of the heater is set to 200° C. and a baking treatment of the base material is performed for 10 minutes. Thereafter, the heater is turned off, and the film formation apparatus is let stand for 30 minutes to cool the inside of the chamber.

Next, the hydrogen gas is supplied at a flow rate of 100 ml/min into the chamber and the exhaust rate is adjusted to set the pressure in the chamber to 100 Pa. Then, the setting temperature of the heater is set to 485° C. and the atmosphere in the chamber is heated for 30 minutes. This heating raises the atmospheric temperature in the chamber up to a temperature near the plasma processing temperature.

Next, the pulse power supply is operated at a voltage: 800 V, a frequency: 25 kHz, a Duty ratio: 30%, and a unipolar output form. This converts the hydrogen gas into plasma between the electrodes in the chamber. Thereafter, the flow rate of the hydrogen gas is increased to 200 ml/min and the nitrogen gas at a flow rate of 50 ml/min and the argon gas at a flow rate of 5 ml/min are supplied into the chamber. In this event, the pressure in the chamber is set to 58 Pa by adjusting the exhaust rate. Then, the voltage of the pulse power supply is raised to 1100 V. This makes a state where the hydrogen gas, the nitrogen gas, and the argon gas are converted into plasma between the electrodes.

<Vanadium Nitride Film Formation Step>

Subsequently, while keeping the flow rate of the hydrogen gas to be supplied at 200 ml/min, the flow rate of the nitrogen gas to be supplied at 50 ml/min, and the flow rate of the argon gas to be supplied at 5 ml/min, the vanadium tetrachloride gas is further supplied into the chamber at a flow rate of 4.4 sccm. Further, the voltage of the pulse power supply is raised from 1100 V to 1500 V. This decomposes the vanadium tetrachloride gas into vanadium and chlorine. Then, vanadium and nitrogen converted into plasma are adsorbed to the base material, whereby a vanadium nitride film is formed on the surface of the base material. This state was maintained for 30 minutes to form vanadium nitride of 0.4 µm on the surface of the base material.

<Vanadium Silicon Carbonitride Film Formation Step>

Subsequently, while keeping the flow rate of the hydrogen gas to be supplied at 200 ml/min, the flow rate of the nitrogen gas to be supplied at 50 ml/min, and the flow rate of the argon gas to be supplied at 5 ml/min, the flow rate of the vanadium tetrachloride gas is raised to 5.0 sccm and a monomethylsilane ($SiH_3CH_3$) gas is further supplied into the chamber at a flow rate of 5.0 sccm. The voltage of the pulse power supply is kept at 1500 V. This decomposes the monomethylsilane gas into silicon and carbon. Then, vanadium, silicon, carbon, and nitrogen converted into plasma are adsorbed to the base material, whereby a vanadium silicon carbonitride film composed of vanadium, silicon, carbon, and nitrogen is formed on the surface of the vanadium nitride film. This state was maintained for 120 minutes to form a vanadium silicon carbonitride film on the surface of the vanadium nitride film.

Through the above steps, a test piece in Example 1 coated with the vanadium silicon carbonitride film was obtained. Summary of the film formation conditions at the vanadium silicon carbonitride film formation step in Example 1 is as in the following Table 1. Further, according to the film formation conditions listed in the following Table 1, test pieces in Examples 2 to 3 and Comparative Example 1 were also manufactured.

TABLE 1

| | | EXAMPLE 1 | EXAMPLE 2 | EXAMPLE 3 | COMPARATIVE EXAMPLE 1 |
|---|---|---|---|---|---|
| VSiCN FILM FORMATION CONDITIONS | HEATER TEMPERATURE (° C.) | 485 | 485 | 485 | 485 |
| | PRESSURE (Pa) | 58 | 58 | 58 | 58 |
| | $H_2$ FLOW RATE (ml/min) | 200 | 200 | 200 | 200 |
| | $N_2$ FLOW RATE (ml/min) | 50 | 50 | 50 | 50 |
| | $VCl_4$ FLOW RATE (sccm) | 5.0 | 5.4 | 4.7 | 7.0 |
| | $SiH_3CH_3$ FLOW RATE (sccm) | 5.0 | 5.0 | 5.0 | 5.0 |
| | Ar FLOW RATE (ml/min) | 5 | 5 | 5 | 5 |
| | VOLTAGE OF PULSE POWER SUPPLY (V) | 1500 | 1500 | 1500 | 1500 |
| | FREQUENCY OF PULSE POWER SUPPLY (kHz) | 25 | 25 | 25 | 25 |
| | DUTY RATIO (%) | 30 | 50 | 30 | 30 |
| | OUTPUT FORM | UNIPOLAR | UNIPOLAR | UNIPOLAR | UNIPOLAR |
| | TREATMENT TIME (min) | 120 | 120 | 120 | 120 |

The film formation conditions of Example 2 are the same film formation conditions as in Example 1 except that the flow rate of the vanadium tetrachloride gas to be supplied into the chamber at the vanadium silicon carbonitride film formation step was changed to 5.4 sccm and the Duty ratio was changed to 50%.

The film formation conditions of Example 3 are the same film formation conditions as in Example 1 except that the flow rate of the vanadium tetrachloride gas to be supplied into the chamber at the vanadium silicon carbonitride film formation step was changed to 4.7 sccm.

The film formation conditions of Comparative Example 1 are the same film formation conditions as in Example 1 except that the flow rate of the vanadium tetrachloride gas to be supplied into the chamber at the vanadium silicon carbonitride film formation step was changed to 7.0 sccm.

The hardness measurement, the film thickness measurement, and the composition analysis of the vanadium silicon carbonitride film were carried out on each of the test pieces each coated with the vanadium silicon carbonitride film. The results of the hardness measurement, the film thickness measurement, and the composition analysis of each of the examples and comparative example are listed in Table 2.

TABLE 2

|  | EXAMPLE 1 | EXAMPLE 2 | EXAMPLE 3 | COMPARATIVE EXAMPLE 1 |
|---|---|---|---|---|
| VICKERS HARDNESS OF VSiCN FILM (HV) | 3366 | 3127 | 2647 | 1369 |
| COMPLEX ELASTIC MODULUS OF VSiCN FILM (GPa) | 280 | 243 | 234 | 156 |
| THICKNESS OF VSiCN FILM (μm) | 2.6 | 2.7 | 2.8 | 2.1 |
| MAXIMUM INDENTATION DEPTH IN MEASURING HARDNESS (μm) | 0.12 | 0.13 | 0.13 | 0.18 |
| COMPOSITION OF VSiCN FILM   V (at %) | 22.3 | 22.8 | 25.6 | 30.5 |
| Si (at %) | 27.2 | 24.4 | 27.1 | 17.5 |
| C (at %) | 21.2 | 22.7 | 20.0 | 20.5 |
| N (at %) | 25.8 | 26.7 | 23.6 | 27.8 |
| BALANCE (at %) | 3.5 | 3.4 | 3.7 | 3.7 |
| V + St + C + N (at %) | 96.5 | 96.6 | 96.3 | 96.3 |
| a = V/(V + Si + C + N) | 0.231 | 0.236 | 0.266 | 0.317 |
| b = Si/(V + Si + C + N) | 0.282 | 0.253 | 0.281 | 0.181 |
| a/b | 0.82 | 0.93 | 0.94 | 1.74 |
| a + b | 0.51 | 0.49 | 0.55 | 0.50 |

(Hardness Measurement)

The hardness measurement was performed by the nano-indentation method using FISCHER SCOPE (registered trademark) HM2000 manufactured by Fischer Instruments. Specifically, a Vickers indenter is pushed into a test piece with a maximum indentation load set to 10 mN, and an indentation depth is continuously measured. Based on the change in the indentation depth, the Martens hardness, the Vickers hardness converted from the Martens hardness, and the complex elastic modulus are calculated by a measuring device. The calculated Vickers hardness is displayed on a screen of the measuring device, and the numerical value is used as the hardness of the film at a measurement point. In this example, the Vickers hardnesses at arbitrary 20 points on the surface of each of the test pieces were obtained, and an average value of the obtained hardnesses was set as the Vickers hardness (HV) of the vanadium silicon carbonitride film.

Note that in pushing the indenter into the test piece, an indentation load propagates to a depth of about 10 times the maximum indentation depth of the indenter in some cases. Therefore, once the propagation of the indentation load reaches the base material of the test piece, the influence of the base material may be included in the result of the hardness measurement. Accordingly, for measuring the real hardness of the hard film, it is necessary to satisfy "the film thickness of the hard film>the maximum indentation depth of the indenter×10".

(Film Thickness Measurement)

As for the film thickness of the vanadium silicon carbonitride film, the test piece was vertically cut, the cut surface was subjected to mirror polishing, then the cut surface was observed under a metallurgical microscope set at 1000-fold magnification, and the film thickness of the vanadium silicon carbonitride film was measured by making a calculation based on the observed image information.

(Composition Analysis of Vanadium Silicon Carbonitride Film)

The composition of the vanadium silicon carbonitride film was analyzed. The analysis conditions are as follows.

Measuring device: EPMA (JXA-8530F manufactured by JEOL Ltd.)
Measurement mode: semiquantitative analysis
Acceleration voltage: 15 kV
Irradiation current: $1.0 \times 10^{-7}$ A
Beam shape: spot
Beam diameter set value: 0
Dispersive crystal: LDE6H, TAP, LDE5H, PETH, LIFH, LDE1H The vanadium element concentration [at %], the silicon element concentration [at %], the carbon element concentration [at %], and the nitrogen element concentration [at %] in the vanadium silicon carbonitride film obtained by the results of the composition analysis are as listed in the above Table 2. Further, a/b and a+b when vanadium element concentration [at %]/(vanadium element concentration [at %]+silicon element concentration [at %]+carbon element concentration [at %]+nitrogen element concentration [at %]) is defined as "a" and silicon element concentration [at %]/(vanadium element concentration [at %]+silicon element concentration [at %]+carbon element concentration [at %]+nitrogen element concentration [at %]) is defined as "b" were calculated. Note that the "balance" in Table 2 is a total amount of the impurities such as chlorine.

Besides, in the case where the film thickness of the vanadium silicon carbonitride film is 1 μm or less, the compositions of components of the base material and other films influence the measurement result of EPMA. Therefore, in the case of analyzing the composition of the vanadium silicon carbonitride film having a small film thickness, it is necessary to perform the EPMA measurement of the test piece before formation of the vanadium silicon carbonitride film in advance, and subtract the vanadium element concentration [at %], the silicon element concentration [at %], the carbon element concentration [at %], and the nitrogen element concentration [at %] derived from the base material and the other films from the measurement result of EPMA after formation of the vanadium silicon carbonitride film. For example, in the case where the vanadium silicon carbonitride film of 1 μm or less has been formed on the surface of the base material containing vanadium, the vanadium element concentration [at %] of the vanadium silicon carbonitride film can be obtained from the following Expression (2) using the vanadium element concentration [at %] of the base material calculated from the following Expression (1). Note that the similar calculation is performed also on silicon, carbon, and nitrogen contained in the base material, whereby the silicon element concentration [at %], the carbon element concentration [at %], and the nitrogen element concentration [at %] of the vanadium silicon carbonitride film can be obtained respectively.

Vanadium element concentration [at %] of base material=(vanadium element concentration [at %] measured in EPMA before formation of vanadium silicon carbonitride film/iron element concentration [at %] measured in EPMA before formation of vanadium silicon carbonitride film)×iron element concentration [at %] measured in EPMA after formation of vanadium silicon carbonitride film   (1)

Vanadium element concentration [at %] of vanadium silicon carbonitride film=vanadium element concentration [at %] measured in EPMA after formation of vanadium silicon carbonitride film−vanadium element concentration [at %] of base material   (2)

As listed in the above Table 2, the Vickers hardnesses HV of the vanadium silicon carbonitride films in Examples 1 to 3 are 2500 or more, so that films having higher hardnesses than the hardness (about HV 2400) of the conventional vanadium carbonitride film (VCN film) ware able to be obtained. On the other hand, the Vickers hardness HV of the vanadium silicon carbonitride film in Comparative Example 1 was 1369 which was a hardness of about ½ of those of the vanadium silicon carbonitride films in Examples 1 to 3. Comparing the values of a/b from the results of the composition analysis of the vanadium silicon carbonitride films in Examples 1 to 3 and Comparative Example 1, the value of a/b of Comparative Example 1 was a value of about 2 times those of Examples 1 to 3. In view of the result, it is found that when the value of a/b is too large, the vanadium silicon carbonitride film cannot obtain sufficient film hardness as the hard film. According to the result of this example, it is conceivable that when the value of a/b is 0.30 to 1.3, sufficient film hardness can be obtained.

Note that the thickness of the vanadium silicon carbonitride film of each of the test pieces listed in Table 2 is a thickness greatly exceeding 10 times the maximum indentation depth by the indenter in measuring the hardness, and the hardness of the vanadium silicon carbonitride film listed in Table 2 is therefore the numerical value not influenced by the hardness of the base material and not influenced by the hardness of the vanadium nitride film formed between the base material and the vanadium silicon carbonitride film. In short, the hardness of the vanadium silicon carbonitride film listed in Table 2 is the hardness of the vanadium silicon carbonitride film itself.

(Heat Resistance Evaluation)

The heat resistance evaluation was carried out by performing a heat treatment on the test piece in Example 1 and a newly manufactured test piece in Comparative Example 2 under conditions of 600° C. for 1 hour in an air atmosphere and measuring the hardness of each of the test pieces after the heat treatment. The hardness of the test piece before the heat treatment and the hardness of the test piece after the heat treatment are compared to evaluate the heat resistance of the vanadium silicon carbonitride film based on the degree of the decrease in hardness after the heat treatment. Note that the test piece in Comparative Example 2 was manufactured under the same film formation conditions as those in Example 1 except that the vanadium silicon carbonitride film formation step was not carried out and the flow rate of the vanadium tetrachloride gas at the vanadium nitride film formation step was changed to 5.1 sccm and the treatment time was set to 180 minutes. The vanadium nitride film is formed on the outermost surface of the test piece in Comparative Example 2.

As a result of measuring the hardness before the heat treatment and the hardness after the heat treatment of each of the test pieces in Example 1 and Comparative Example 2, the hardness at the point in time of the film formation processing of the test piece in Example 1 was 3366 HV and the hardness at the point in time of the film formation processing of the test piece in Comparative Example 2 was 2989 HV. In short, both of the test piece in Example 1 and the test piece in Comparative Example 2 had sufficient film hardnesses at the point in time of the film formation processing. On the other hand, the hardness of the test piece after the heat treatment in Example 1 was 2957 HV, and the hardness of the test piece after the heat treatment in Comparative Example 2 was 200 HV showing that the hardness decreased.

According to the test result of the heat resistance evaluation, it is found that the vanadium silicon carbonitride film according to the present invention is improved in heat resistance with respect to the vanadium nitride film. The reason why the vanadium silicon carbonitride film in not decreased in hardness after the heat treatment as described above is conceivable that a thin silicon oxide film is formed on the surface of the vanadium silicon carbonitride film during the heat treatment and the silicon oxide film hinders oxygen in the atmosphere from combining with carbon in the vanadium silicon carbonitride film.

INDUSTRIAL APPLICABILITY

The present invention is applicable to a hard film treatment of a metal die, a cutting tool, a gear cutting tool, a forging tool, an automotive part and so on.

EXPLANATION OF CODES 1 vanadium silicon carbonitride film coated member
2 base material
3 vanadium nitride film
4 vanadium silicon carbonitride film
10 plasma processing apparatus
11 chamber
12 anode
13 cathode
14 pulse power supply
15 gas supply pipe
16 gas exhaust pipe

The invention claimed is:

1. A vanadium silicon carbonitride film comprising vanadium, silicon, carbon, and nitrogen,
wherein when vanadium element concentration [at %]/(vanadium element concentration [at %]+silicon element concentration [at %]+carbon element concentration [at %]+nitrogen element concentration [at %]) in the film is defined as a, and
silicon element concentration [at %]/(vanadium element concentration [at %]+silicon element concentration [at %]+carbon element concentration [at %]+nitrogen element concentration [at %]) in the film is defined as b, $0.30 \leq a/b \leq 1.3$ and $0.30 \leq a+b \leq 0.70$ are satisfied, and a total of the vanadium element concentration [at %], the silicon element concentration [at %], the carbon element concentration [at %], and the nitrogen element concentration [at %] in the film is 90 [at %] or more.

2. The vanadium silicon carbonitride film according to claim 1,
wherein the carbon element concentration is 10 [at %] or more, and the nitrogen element concentration is 10 [at %] or more.

3. A vanadium silicon carbonitride film coated member, wherein the vanadium silicon carbonitride film according to claim 1 is formed on a base material.

4. The vanadium silicon carbonitride film coated member according to claim 3,
wherein a vanadium nitride film is provided between the base material and the vanadium silicon carbonitride film.

5. A method for manufacturing a vanadium silicon carbonitride film coated member,
wherein the vanadium silicon carbonitride film coated member is manufactured by forming a vanadium silicon carbonitride film on a base material by a plasma chemical vapor deposition method using a raw material gas,
the raw material gas comprising:
a nitrogen source gas composed of one or more of gasses selected from the group consisting of a nitrogen gas and an ammonia gas;
a hydrogen gas;
a vanadium chloride gas;
a silicon source gas;
a carbon source gas, and
wherein when vanadium element concentration [at %]/(vanadium element concentration [at %]+silicon element concentration [at %]+carbon element concentration [at %]+nitrogen element concentration [at %]) in the vanadium silicon carbonitride film is defined as a, and silicon element concentration [at %]/(vanadium element concentration [at %]+silicon element concentration [at %]+carbon element concentration [at %]+nitrogen element concentration [at %]) in the vanadium silicon carbonitride film is defined as b,
$0.30 \leq a/b \leq 1.3$ and $0.30 \leq a+b \leq 0.70$ are satisfied, and a total of the vanadium element concentration [at %], the silicon element concentration [at %], the carbon element concentration [at %], and the nitrogen element concentration [at %] in the vanadium silicon carbonitride film is 90 [at %] or more.

6. The method for manufacturing a vanadium silicon carbonitride film coated member according to claim 5,
wherein an organic silane gas is used as the silicon source gas and the carbon source gas.

7. The method for manufacturing a vanadium silicon carbonitride film coated member according to claim 6,
wherein the raw material gas further comprises an argon gas, and
wherein flow rates of the gases are adjusted in forming the vanadium silicon carbonitride film on the base material so that when a partial pressure of the vanadium chloride gas is 1, a ratio of partial pressures of the vanadium chloride gas, the organic silane gas, the nitrogen source gas, the hydrogen gas, and the argon gas is 1:0.8-1.4:8-14:30-55:0.8-1.4.

8. The method for manufacturing a vanadium silicon carbonitride film coated member according to claim 6,
wherein the organic silane gas is a monomethylsilane gas.

9. The method for manufacturing a vanadium silicon carbonitride film coated member according to claim 5,
wherein the vanadium chloride gas is a vanadium tetrachloride gas.

* * * * *